United States Patent
Nishiura et al.

[11] Patent Number: 5,967,401
[45] Date of Patent: Oct. 19, 1999

[54] WIRE BONDING METHOD

[75] Inventors: Shinichi Nishiura, Fussa; Tooru Mochida, Higashiyamato, both of Japan

[73] Assignee: Kabushiki Kaisha Shinkawa, Tokyo, Japan

[21] Appl. No.: 08/998,903

[22] Filed: Dec. 29, 1997

[30] Foreign Application Priority Data

Dec. 27, 1996 [JP] Japan ..................... 8-357518

[51] Int. Cl.$^6$ ................................. H01L 21/60
[52] U.S. Cl. ............................ 228/180.5; 228/4.5
[58] Field of Search ................... 228/102, 111, 228/180.5, 4.5, 110.1, 1.1

[56] References Cited

U.S. PATENT DOCUMENTS

| | | | |
|---|---|---|---|
| 4,327,860 | 5/1982 | Kirshenboin et al. | 228/180.5 |
| 4,932,584 | 6/1990 | Yamazaki et al. | 228/180.5 |
| 4,976,392 | 12/1990 | Smith et al. | 228/102 |
| 5,111,989 | 5/1992 | Holdgrafer et al. | 228/180.5 |
| 5,192,018 | 3/1993 | Terakado et al. | 228/4.5 |

FOREIGN PATENT DOCUMENTS

| | | |
|---|---|---|
| H4-318943 | 11/1992 | Japan . |
| H5-60657 | 9/1993 | Japan . |

*Primary Examiner*—Samuel M. Heinrich
*Attorney, Agent, or Firm*—Koda & Androlia

[57] ABSTRACT

A method for moving a capillary so as to connect wire to a first bonding point and then to a second bonding point in manufacturing, for instance, semiconductor devices, including the steps of moving the capillary in a opposite direction from the second bonding point after moving the capillary away from the first bonding point, and then moving the capillary slightly towards the first bonding point so as to form a firm kink in the wire, and after which the capillary is further moved away from the first bonding point delivering the wire, and then the capillary is moved towards the second bonding point to connect the wire to the second bonding point.

3 Claims, 4 Drawing Sheets

WIRE BONDING METHOD

BACKGROUND OF THE INVENTION

1. Field of the Invention

The present invention relates to a wire bonding method in which a first bonding point and a second bonding point are connected by a bonding wire in a semiconductor device manufacturing process and more specifically to a wire loop formation method employed in such a wire bonding method.

2. Prior Art

As shown in FIG. 4(a) and 4(b), in a semiconductor device, a pad 2a (first bonding point) on a semiconductor chip 2 mounted on a lead frame 1 and a lead 1a (second bonding point) on the lead frame 1 are connected by a bonding wire (called merely "wire") 3. The loop shape of the wire 3 in this case may be a trapezoidal loop shape as shown in FIG. 4(a) or a triangular loop shape as shown in FIG. 4(b).

Wire loop formation methods of this type are described in, for example, Japanese Patent Application Publication (Kokoku) No. 5-60657 and Japanese Patent Application Laid-Open (Kokai) No. 4-318943.

The trapezoidal loop shown in FIG. 4(a) is formed by the process shown in FIG. 5.

In step (a) in FIG. 5, a capillary 4 is lowered with a clamper (not shown) which holds, in its closed state, a bonding wire 3, so that a ball formed on the tip end of the wire is bonded to a first bonding point A. After this, the capillary 4 is raised to point B, delivering the wire 3.

Next, as seen in step (b), the capillary is moved horizontally in the opposite direction from the second bonding point G to point C. Generally, a loop formation operation in which the capillary 4 is moved in the direction opposite from the second bonding point G is referred to as a "reverse operation". Because of this reserve operation, the wire 3 assumes a shape that extends from point A to point C; and as a result, a kink 3a is formed in a portion of the wire 3. The wire 3 delivered out of the capillary 4 in the process from point A to point C forms the neck height portion 31 of the loop shown in FIG. 4(a).

Next, as shown in step (c) in FIG. 5, the capillary 4 is raised to point D, delivering the wire 3.

Afterward, as shown in step (d), the capillary 4 is again moved horizontally to point E in the opposite direction from the second bonding point G, i.e., another (or second) reverse operation is performed. As a result, the wire 3 assumes a shape inclined from point C to point E, and a kink b is formed in a portion of the wire 3 by the lower end portion of the capillary 4. The wire 3 delivered out of the capillary 4 during the process from point C to point E forms the trapezoidal length portion 32 shown in FIG. 4(a).

In addition, as shown in step (e), the capillary 4 is raised to point F delivering an amount of wire 3 equal to the inclined portion 33 shown in FIG. 4(a). Afterward, the clamper (again, not shown) is closed. Once the clamper is closed, the wire 3 is not delivered out even if the capillary 4 subsequently is moved.

Furthermore, as shown in steps (f) and (g), the capillary 4 performs a circular-arc motion (or a circular-arc motion followed by a straightly lowering motion) so that the capillary 4 is positioned at the second bonding point G, and the wire 3 is bonded to the second bonding point G, thus connecting the first and second bonding points A and G.

On the other hand, the triangular loop shown in FIG. 4(b) is formed by the process shown in FIG. 6.

In this triangular loop formation, the trapezoidal length portion 32 described in the above loop formation is not formed. Accordingly, the second reverse operation in step (d) in FIG. 5 is not performed. Thus, the steps (c), (d) and (e) in FIG. 5 are replaced by the single process as shown in step (c) of FIG. 6. In particular, the steps (a) and (b) are the same as the steps shown in FIG. 5, respectively; and after the first reverse operation in step (b) of FIG. 6, the capillary 4 is raised to point F delivering the wire 3 in step (c). Afterward, the capillary 4 performs the operations steps (d) and 6(e) in the same manner as the operations done in the steps (f) and (g) shown in FIG. 5, so that the wire 3 is bonded to the second bonding point G.

As seen from the above, the triangular loop formation shown in FIG. 6 is simpler than the trapezoidal loop formation shown in FIG. 5 and is therefore advantageous in that the loop formation is performed in a shorter time. However, in cases where the step height between the first bonding point A and the second bonding point G is large (for instance, about 100–350 $\mu$m), or in cases where the first bonding point A and the edge portion of the semiconductor chip 2 are separated by a conspicuously large distance (for instance, about 500 $\mu$m), the wire 3 tends to come into contact with the edge portion of the semiconductor chip 2 when the triangular wire loop shape as shown in FIG. 4(b) is formed. In such cases, the trapezoidal wire loop formation is employed to form the wire as shown in FIG. 4(a) so as to avoid the contact between the wire 3 and semiconductor chip 2.

In the trapezoidal loop formation shown in FIG. 5, whether or not the kink b can be formed in the wire 3 by the capillary 4 using the reverse operation depends upon the wire length (height) from the first bonding point A to the kink b. As the height increases, formation of the kink b tends to become more difficult. The first reverse operation shown in step (b) of FIG. 5 is performed with the capillary 4 positioned at a height near the height of the first bonding point A; accordingly, a relatively strong kink 3a can easily be formed.

However, the second reverse operation in step (d) in FIG. 5 is performed with the capillary 4 at a high position which is far from the first bonding point A; accordingly, the kink 3b is difficult to form, and its angle is unstable from kink to kink. As a result, since the portion of the wire near the kink 3b shown in FIG. 4(a) is unstable and has a weak shape-retaining strength, the portion of the wire near the kink 3b may rise upward to a point higher than the portion of the wire near the kink 3a. If the shape-retaining strength of the portion of the wire near the kink 3b is weaker than the portion of the wire near the kink 3a, then the wire bends when a pressure is applied thereon. For example, wire bending may easily occur by external forces such as shocks or vibration of the wire 3 because the capillary contacts the second bonding point G or because the ultrasonic oscillation is applied during bonding of the second bonding point G. Such a wire bending may be further caused by a mold flow due to the injection of molding material during molding, etc.

Accordingly, so as to avoid these problems, the shape-retaining strength of the kink 3b is reinforced in conventional methods by increasing the amount of reverse movement of the capillary in the step (d) shown in FIG. 5. In this case, however, since the capillary 4 needs to be moved a further distance, bonding takes longer because of the corresponding longer moving amount; and in addition, since the neck portion of the wire is bent further, separate problems, such as a neck damage, likely to occur.

SUMMARY OF THE INVENTION

Accordingly, the object of the present invention is to provide a wire bonding method which solves the problems of the above-described trapezoidal loop and makes it possible to form a stable wire loop shape which has a high shape-retaining strength.

The above object is accomplished by a unique method of the present invention for connecting a first bonding point and a second bonding point by a bonding wire, involving a reverse operation that causes a capillary to move in a direction opposite from a second bonding point during a wire loop formation, and wherein the capillary is lowered slightly after the reverse operation is made, and then the capillary is raised.

The above object is accomplished by another unique method of the present invention for connecting a first bonding point and a second bonding point with a bonding wire, and the method comprises: (a) a process in which the wire is connected to the first bonding point, (b) a process in which a first reverse operation, in which a capillary is raised and is then moved in the opposite direction from the second bonding point, is performed, (c) a process in which a second reverse operation, in which the capillary is raised and is then moved in the opposite direction from the second bonding point, is performed, (d) a process in which the capillary is lowered slightly, and (e) a process in which the capillary is raised delivering the wire, after which the capillary is moved toward the second bonding point and the wire is connected to the second bonding point.

DETAILED DESCRIPTION OF THE INVENTION

Figure 4A:
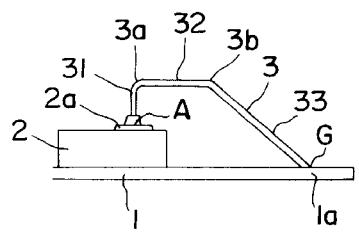
FIG. 4(*a*) shows the wire loop shape of a trapezoidal loop, while FIG. 4(*b*) shows the wire loop shape of a triangular loop.
Figure 4B:
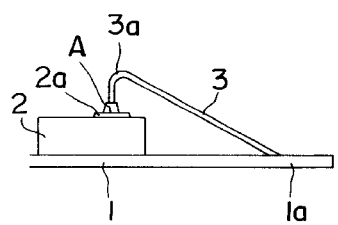
Figure 5:
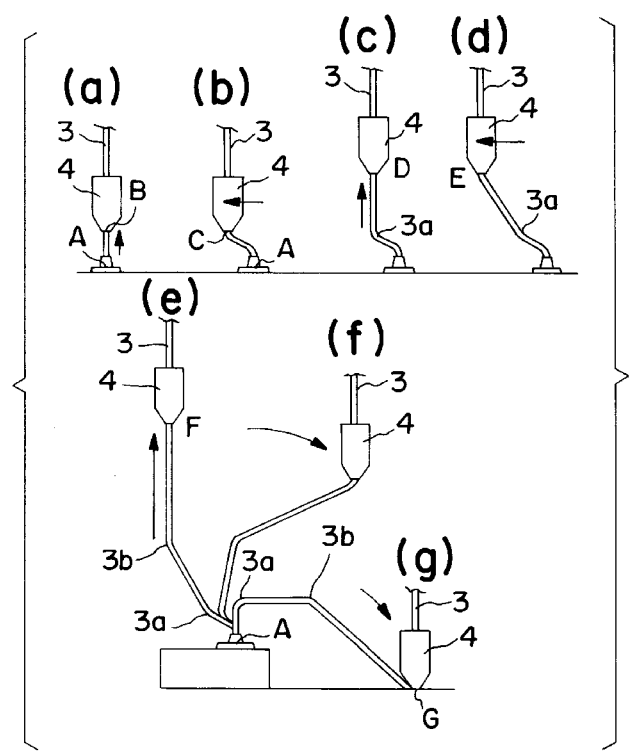
FIG. 5 is a diagram which shows the loop shape at various points in time according to the path of the prior art moving capillary used to form a trapezoidal loop.
Figure 6:
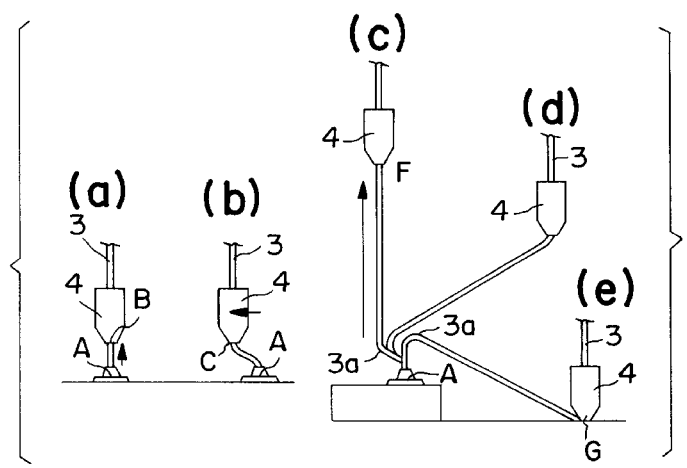
FIG. 6 is a diagram which shows the loop shape at various points in time according to the path of the prior art moving capillary used to form a triangular loop.

One embodiment of the present invention will be described with reference to FIGS. 1 through 3. Furthermore, constituting elements which are the same as in FIG. 4(*a*) and FIG. 5, or which correspond to the elements in FIG. 4(*a*) and FIG. 5, will be labeled with the same symbols in the following description.

Figure 1:
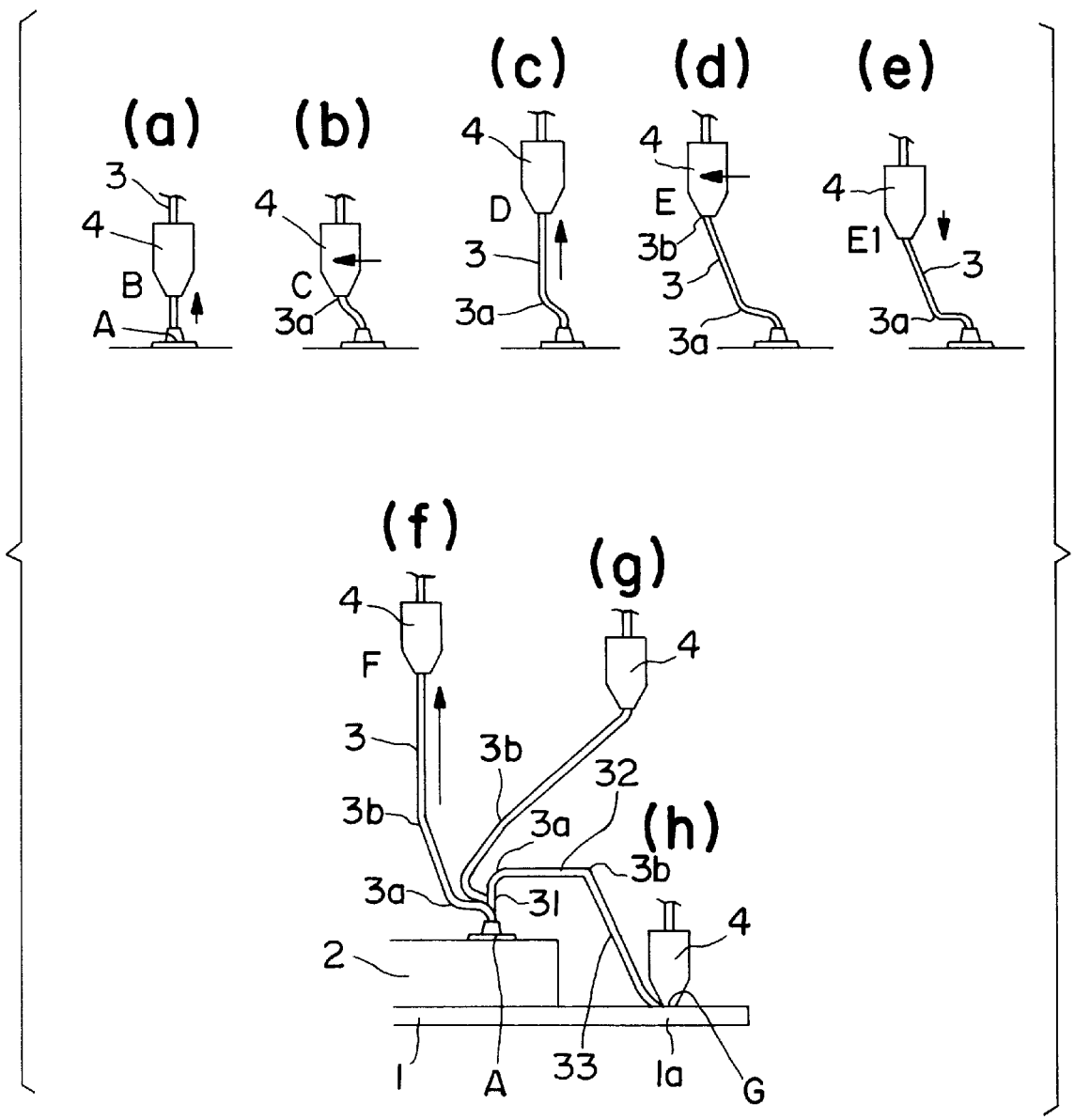
FIG. 1 is an explanatory diagram which illustrates one embodiment of the wire shape at various points in time according to the path of the moving capillary in the present invention.
Figure 2:
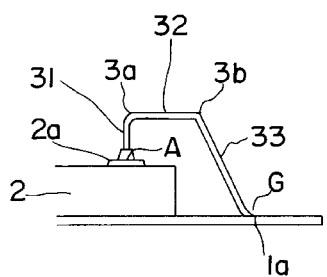
FIG. 2 is a diagram which illustrates the connected bonding wire.
Figure 3:
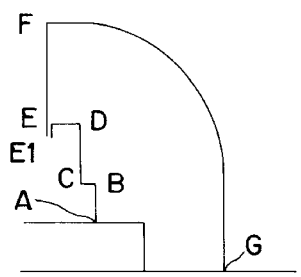
FIG. 3 is a diagram which illustrates path of the moving capillary.

FIG. 1 shows different wire shapes at various points on the path which the capillary 4 through which a bonding wire 3 passes, FIG. 2 shows the wire 3 connected, and FIG. 3 shows the path along with the capillary is moved. In the shown embodiment, the step shown in (e) of FIG. 1 is performed between the processes shown in steps (d) and (e) of FIG. 5 for the trapezoidal loop; the remaining steps are the same as in the method shown in FIG. 5. In other words, the steps (a) through (d) shown in FIG. 1 correspond to the steps (a) through (d) shown in FIG. 5, and the steps (f) through (h) shown in FIG. 1 correspond to the steps (e) through (g) shown in FIG. 5.

First, the steps (a) through (d) shown in FIG. 1, which are the same as in a conventional method, will be described.

In step (a), the capillary 4 is lowered with the clamper (not shown) which holds the wire 3 kept closed, so that a ball (not shown) formed at the tip end of the wire 3 is bonded to the first bonding point A, after which the capillary 4 is raised to point B delivering the wire 3.

Next, as shown in step (b), a reverse operation is performed. In other words, the capillary 4 is moved horizontally to point C in a direction opposite from the second bonding point G (see steps (f)–(h) for the location of point G). As a result, a first kink 3*a* is formed in a portion of the wire 3 in the same manner as in a conventional method. During this step, the wire 3 is delivered out of the capillary 4 in the process in which the capillary 4 is moved from point A to point C forms a neck height portion 31 of the loop shown in FIG. 2.

Next, as shown in step (c), the capillary 4 is raised to point D, delivering the wire 3.

Afterward, at step (d), the capillary 4 is moved in the opposite direction from the second bonding point G. In other words, a second reverse operation is performed so that the capillary 4 is moved horizontally to point E. As a result of the operation from point C to point E, a second kink 3*b* is formed in the wire 3. Furthermore, the wire 3 delivered out of the capillary 4 at this time forms the trapezoidal length portion 32 shown in FIG. 2.

Next, the steps which characterize the invention are performed.

As shown in step (e) in FIG. 1, the capillary 4 is lowered slightly to point El. In other words, the capillary 4 is moved downward slightly (for instance, about 50–100 $\mu$m) a distance less than, at least, the distance in which the capillary 4 is moved upward in step (c) or form point C to point D. As a result of this lowering motion of the capillary 4, the second kink 3*b* is fixed in place, and the position of this second kink 3*b* is stabilized; furthermore, a wire loop shape with a high shape-retaining strength is obtained.

Afterward, in the same manner as in a conventional method, the capillary 4 is raised to point F, delivering the wire 3 as shown in step (f).

Next, the clamper (not shown) is closed. Once the clamper is closed, the wire 3 is not delivered out since the wire 3 is held by the clamper, even if the capillary 4 is subsequently moved.

Next, as shown in steps (g) and (h), the capillary 4 is moved horizontally toward the second bonding point G and caused to make a circular-arc motion (or a circular-arc motion followed by a straightly lowering motion), so that the capillary 4 is positioned on the second bonding point G, and then the wire 3 is bonded to the second bonding point G.

The operation from point F to the second bonding point G has no particular relationship with the gist of the present invention, and it goes without saying that it would also be possible to perform an operation similar to the operation disclosed in the conventional method or to perform some other type of operation.

Furthermore, in the above embodiment, an operation in which the capillary 4 is slightly lowered is performed after the second reverse operation (i.e., the operation in which the capillary 4 is moved from point D to point E in FIG. 3). However, it is also possible to perform an operation in which the capillary 4 is slightly lowered after the first reverse operation (i.e., the operation in which the capillary 4 is moved from point B to point C in FIG. 3). In this case, though the effect might be smaller than in a case where this operation is performed after the second reverse operation, the first kink 3a at the top of the neck height part 31 is reinforced compared to that in a conventional example.

As seen from the above, in the present invention, regardless of a single reverse operation or a plurality of reverse operations, the capillary 4 is lowered slightly after at least one reverse operation.

As described in detail above, the capillary is lowered slightly after a reverse operation of a capillary is done; and then, the capillary is raised delivering the wire. Accordingly, a strong kink is formed in the wire. Especially in cases where the capillary is lowered slightly after the second reverse operation, the kink at the boundary between the trapezoidal length portion and inclined portion of the trapezoidal loop can be fixed and made secure. As a result, a stable loop shape which does not rise up can be obtained not only in the case of short loops that involve a short wiring distance but also in the case of long loops that have a long wire distance.

Furthermore, according to the present invention, a loop that has a high shape-retaining strength against externally applied pressure is obtained, and bending of the wire caused by externally applied pressure is, as a result, prevented. For example, the wire loop has a high shock-absorbing capacity for external forces such as shocks or vibration of the wire due to capillary contact or ultrasonic oscillation during bonding to a second bonding point, or mold flow due to the injection of molding material during molding, etc., so that the wire is prevented from bending. Furthermore, since only a short moving distance of the capillary is required, the bonding time can be shortened, and the bending of the wire in the neck portion can be reduced, thus neck damages can be minimized.

What is claimed is:

1. A wire bonding method in which a first bonding point and a second bonding point are connected by a wire, and in which a reverse operation which causes a capillary to move in a horizontal direction opposite from said second bonding point during a wire loop formation is performed, wherein said method further comprises lowering said capillary slightly after said reverse operation, and then raising said capillary.

2. A wire bonding method for connecting a first bonding point and a second bonding point by a wire, said method comprising the steps of:

connecting said wire to said first bonding point;

performing a first reverse operation in which a capillary is raised and then moved in a direction opposite from said second bonding point;

performing a second reverse operation in which said capillary is raised and then moved in a direction opposite from said second bonding point;

lowering said capillary slightly, and raising said capillary thus delivering said wire, moving said capillary toward said second bonding point, and connecting said wire to said second bonding point.

3. A wire bonding method for connecting a first bonding point and a second bonding point by a wire which passes through a capillary movable vertically and horizontally, said method comprising the steps of:

connecting said wire to said first bonding point;

moving said capillary in a direction away from said first bonding point;

moving said capillary in a direction opposite from said second bonding point;

moving said capillary in a direction away from said first bonding point for a first distance;

moving said capillary in a direction opposite from said second bonding point;

moving said capillary in a direction toward said first bonding point for a second distance which is shorter than said first distance;

moving said capillary in a direction away from said first bonding direction, delivering said wire; and moving said capillary toward said second bonding point and then connecting said wire to said second bonding point.

* * * * *